United States Patent

Straccia et al.

[15] 3,696,936

[45] Oct. 10, 1972

[54] PRINTED CIRCUIT CARD RACK

[72] Inventors: William J. Straccia, Allentown; Brooke E. Gernert, Topton; Ronald B. Sherer, Allentown, all of Pa.

[73] Assignee: Electro-Space Fabricators, Inc., Topton, Pa.

[22] Filed: Dec. 15, 1970

[21] Appl. No.: 98,222

[52] U.S. Cl. .................................... 211/41, 317/101

[51] Int. Cl. ............................................ A47g 19/08

[58] Field of Search .................. 211/41, 46; 317/101

[56] References Cited

UNITED STATES PATENTS

| | | | |
|---|---|---|---|
| 1,433,274 | 10/1922 | Harris | 211/41 |
| 2,986,281 | 5/1961 | Jordan | 211/41 |
| 3,016,148 | 1/1962 | Riddle | 211/41 |
| 3,271,626 | 9/1966 | Howrilka | 211/41 X |
| 3,349,924 | 10/1967 | Maurer | 211/41 X |
| 3,465,891 | 9/1969 | DeRose | 211/41 |
| 3,511,385 | 5/1970 | Ayling | 211/41 |
| 3,563,391 | 2/1971 | Weltha | 211/41 |

*Primary Examiner*—Nile C. Byers, Jr.
*Attorney*—Ronald B. Sherer

[57] ABSTRACT

A printed circuit card rack is disclosed having end plates and shelf members, which are accurately positioned by and secured together by means of flanges and tabs forming integral portions of the end plates. The shelf members are provided with holes and slots for receiving flexible snap-in card guides which are free to expand and contract so as to accommodate printed circuit cards of varying size. The shelf members are further provided with maximum air flow circulation vents extending between each pair of adjacent card guides.

8 Claims, 6 Drawing Figures

PATENTED OCT 10 1972 3,696,936

WILLIAM J. STRACCIA
BROOKE E. GERNERT
RONALD B. SHERER

INVENTORS

PRINTED CIRCUIT CARD RACK

BACKGROUND OF THE INVENTION

The present invention relates to the field of modular electronic assemblies and, more particularly, to a cage or rack for mechanically and electrically coupling a plurality of printed circuit (P.C.) boards or cards so as to constitute an electronic circuit, or bank of circuits.

With the advent of printed circuits, many attempts have been made to design cages or racks for holding a series of removable, plug-in-type P.C. boards. However, many prior rack designs have resulted in substantial problems of mis-alignment between the P.C. card plugs and their respective receptacles. Also, the vibrations to which many electronic modules are subjected have caused damage to the components of the P.C. cards, or have caused loose, undersized cards to fall out of position. Thus, present rack designs require that the P.C. cards be fabricated to extremely close tolerances so that each is perfectly fitted between the upper and lower guides. Since such close tolerances are nearly impossible to maintain, oversized cards often spread the shelf members apart which results in the adjacent cards being loose even if they are within the correct tolerances. If the adjacent cards are undersize, they are excessively loose and subject to severe problems of misalignment, vibration and falling out. Thus, oversized cards have required expensive trimming, while undersized cards cannot be compensated for at all.

In addition, many aero-space applications require extra lightweight racks, while also requiring extreme rigidity and high resistance to vibrational stress. Lastly, P.C. racks generally require maximum ventilation to keep the electronic components from overheating, and there has long been a need for lower cost racks which can be manufactured on an assembly line basis notwithstanding wide variations in rack sizes.

SUMMARY OF THE INVENTION

The present invention meets all of the above-identified requirements by a unique combination of features which include:

a. A simple, four member rack comprising two end plates with integral tabs and flanges, and two shelf members which are automatically positioned by the tabs and flanges so as to guarantee precision positioning of the parts and permit rapid spot welding or bolting without special jigs and fixtures;

b. A rigid, lightweight assembly employing thin gage metal sheets having integral, channel-shaped shelf members to provide an exceptionally high degree of rigidity, while also providing large vents for air circulation;

c. A unique combination of holes and slots for receiving prebowed, flexible guides which are removably snapped in place, and which readily accommodate P.C. cards of varying size by flattening out while horizontally elongating to any desired extent. Thus, each card is firmly held in place and size variations between individual cards do not adversely effect adjacent cards which are held equally firmly; and d. A precision alignment is provided between each P.C. card guide and its corresponding connector whereby the plugs on each P.C. card are perfectly received by its respective connector.

DETAILED DESCRIPTION

Figures 1, 2, 3, 4:
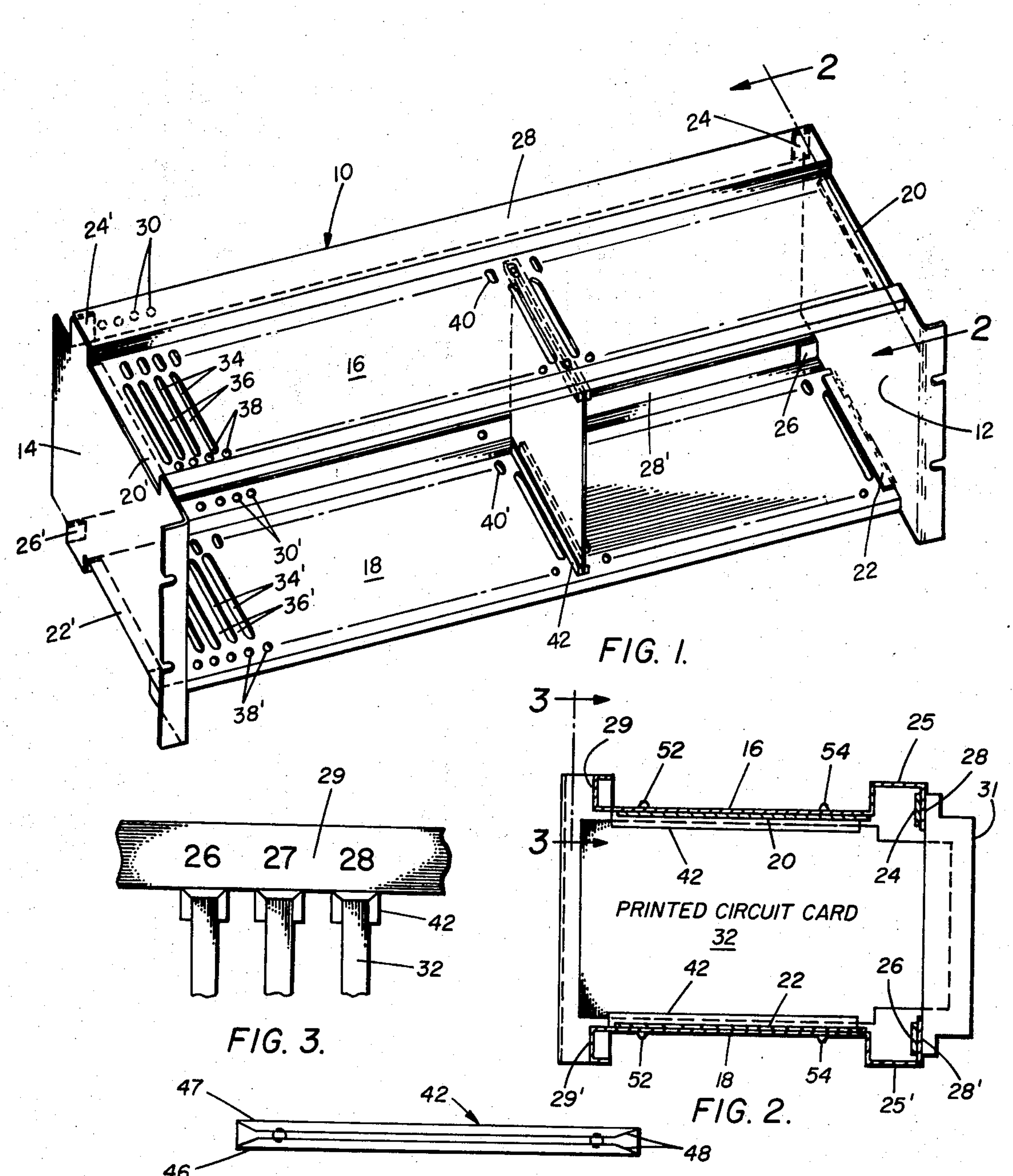
FIG. 1 is a perspective view of the P.C. card rack showing one P.C. card in one pair of guides.
FIG. 2 is a cross-sectional end view taken along the vertical plane indicated by view line 2—2 in FIG. 1.
FIG. 3 is a front elevational view taken along the plane indicated by view line 3—3 showing a fragmentary portion of the front of the upper shelf member with several guides in place.
FIG. 4 is an enlarged, top plan view of one of the card guides.

Referring first to FIGS. 1 and 2, the cage or rack 10 comprises a pair of vertical end plates 12, 14 which support a pair of horizontally extending, vertically spaced, upper and lower support members or shelves 16 and 18. Plate 12 includes upper and lower flanges 20, 22 which are integral with the end plate, and which are bent inwardly at a right angle so as to extend in the upper and lower horizontal planes. The rearward portion of end plate 12 further includes a pair of upper and lower tabs 24, 26 which are also integral with the end plate, and which are bent inwardly at a right angle so as to extend in the vertical plane. Similarly, plate 14 includes corresponding flanges 20', 22' and tabs 24', 26' which are bent inwardly at right angles so as to extend in the same planes as their counterparts of plate 12.

Lower shelf member 18 extends below flanges 22, 22' and, as most clearly shown in FIG. 2, the rear portion is bent at three right angles so as to form a channel shaped portion 25' which terminates in upwardly projecting flange 28' extending behind tabs 26, 26'. Similarly, top shelf member 16 extends over flanges 20, 20' and has a rear portion which is bent at three right angles so as to form a channel shaped portion 25 and which terminates in a downwardly projecting flange 28 which extends behind tabs 24, 24'. As further shown in FIG. 2, the front portions of the upper and lower shelf members are bent at two right angles so as to form a second set of smaller, channel shaped portions 29, 29' which, in combination with the previously described rear channel portions, provide extreme rigidity while permitting the use of lightweight sheet metal, such as aluminum, steel or stainless steel, for the shelf members. It will also be noted that flanges 28, 28' are provided with a series of holes 30, 30' which are used to bolt or otherwise secure female electrical connectors 31 to the back of the rack. Also, the flat front face of edges 29 and the flat rear face of flange 28 provide smooth, integral surfaces upon which index numerals are stamped, stenciled or otherwise imprinted as shown in FIG. 3; thus eliminating the need for separate strips or index markers to identify the position of each P.C. board 32 and associated connector 31.

The cage thus far described is readily assembled by positioning the end plates and the upper and lower shelf members as shown in FIG. 1 and, preferably, spot welding the upper and lower shelf members to flanges 20, 20', 22, 22' and tabs 24, 24', 26 and 26'. In this regard, it will be noted that the flanges can be positioned with extreme accuracy, and that they automatically determine the precise vertical spacing between the upper and lower members. Similarly, the tabs automatically insure perfect positioning in the front-to-back direction so that close tolerances of ±0.005 can be maintained without any jigs, fixtures or alignment devices. Alternatively, the shelf members may be bolted to the flanges and tabs if disassembly is desired.

As shown in FIG. 1, upper member 16 is further provided with a series of elongated slots or vents 34 which are interspaced by relatively narrow solid portions 36. Lower member 18 is similarly provided with vertically aligned slots 34' and vertically aligned solid portions 36'. Along the front portion of upper member 16 there are provided a series of small apertures in the form of holes 38, each of which is centered between a pair of vents 34, while lower member 18 is provided with a similar series of small apertures in the form of holes 38' which are in vertical alignment with upper holes 38. Along the rear portion of upper member 16, a series of small apertures in the form of slots 40 are provided with each slot centered between a pair of vents 34 and in front-to-back alignment with the front holes 38. Similarly, a series of small apertures in the form of slots 40' are provided along the rear portion of lower member 18 such that they are in vertical alignment with upper slots 40.

Figure 6:
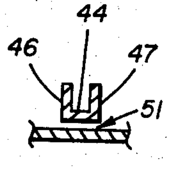
FIG. 6 is a sectional view taken along the vertical plane indicated by view line 6—6 of FIG. 5.
Figure 5:
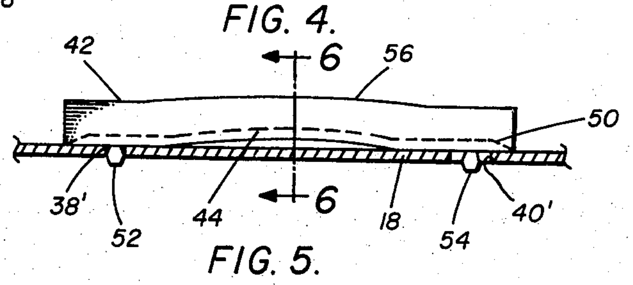
FIG. 5 is an enlarged side elevational view of one of the card guides when inserted into the bottom shelf member, a portion of the latter being shown in cross-section.

As most clearly shown in FIGS. 1, 2, and 5, the cage or rack is adapted to receive upper and lower series of molded guides 42 all of which are identical and one of which is shown in greater detail in FIGS. 4, 5, and 6. Each of guides 42 includes a base 44 and a pair of upstanding sides 46, 47 which form a U-shaped cross-section. The ends of sides 46 and 47 are bevelled at 48, while the ends of the base portions 44 are bevelled to form ramps 50.

The guides 42 are preferably composed of polymeric material such as Nylon, Teflon or other homo and copolymers, hereinafter collectively termed as plastic materials. Alternatively, the guides may be composed of stamped or cast metallic materials such as steel or beryllium-copper, or aluminum, however the plastic materials are preferred from the standpoint of cost and greater flexibility; i.e., resilient deformability.

As shown most clearly in FIG. 5, each of the guides is molded with a pair of integral snap projections 52, 54 which are shaped with enlarged mid-portions so as to snap into aligned holes 38 and slots 40, or aligned holes 38' and slots 40'. That is, projections 52 are shaped and sized so as to snap into holes 38 or 38' and thereby rigidly secure the left end of the guide as viewed in FIG. 5. Projections 54 are also shaped and sized so as to snap into small slots 40 or 40' and be retained therein by the side edges of these slots. However, the slots 40, 40' are longer than the diameter of projections 54 such that the right end of the guide is free to expand and contract for reasons which will become more fully apparent hereinafter.

As further shown in FIG. 5, the base portion 44 is molded with an arcuate form or curvature in the mid-portion. Thus, there is a clearance space 51 between the bottom surface of base 44 and the upper surface of member 18 so that the mid portion of the guide is free to flex downwardly viewed in FIGS. 5 and 6. Of course, the same relationship is true with respect to each guide 42 and upper member 16 whereby the mid-portions of the upper guides are free to flex upwardly.

In FIG. 5, the upper horizontal edges of sides 46, 47 are shown as having a slight upward curvature, particularly in the mid-portion 56. Alternatively, the upper edges may be molded with a straight edge, and only base portion 44 molded with a curvature. Of course, the curvature of the edges and the base may, if desired, extend the full length of the guide, however, curved or pre-bowed mid-portions are preferred for reasons which will subsequently become apparent.

From the foregoing structural description it will be apparent that the initial insertion of a printed circuit board 32 56 is facilitated and guided by bevelled edges 48 and ramps 50. As the card is further pushed into a pair of upper and lower guides, the mid-portions of the guides are flexed toward respective members 16, 18 and the guide is slightly elongated as base portions 44 become less arcuate and more flattened. This elongation is possible by virtue of small slots 40, 40' which permit snap projections 54 to move horizontally within the slots while retaining projections 54 snapped therein. Since the guides are wholly free to elongate, they are extremely flexible and P.C. cards of varying size are easily inserted. However, due to the resiliency of the guides, the cards are held quite firmly and are retarded from falling or vibrating out of position. Thus, the pre-bowed midportions enable easy insertion of the P.C. cards, and exert an optimum pressure on the central portions of the card. If the guides have initially curved edges 56, these edges become flattened as the mid-portion of the guide is resiliently pressed toward shelf member 16 or 18. Alternatively, if edges 56 are initially straight, they will become slightly curved as base portion 44 is flattened out; however sides 46, 47 are of sufficient height so as to retain the P.C. card edge below guide edge 56 in any event. If, as mentioned hereinabove, the entire length of the guide is made curved or pre-bowed, the same result will occur, however, curved mid-portions are preferred so that the end portions are maintained flat against the shelf members at all times and do not tend to pull the projections out of their snapped-in position when the guides are not flattened out by the P.C. cards.

From the foregoing description it will be apparent that the present invention provides for the resilient retention of P.C. cards of varying size, whereby an oversized card does not spread shelf members 16, 18 apart and undersized cards are also firmly retained in the rack regardless of the size of adjacent cards. Also, the width of vents 34 is substantially equal to the width of solid portions 36 which, in turn, is substantially equal to the width of guides 42. Thus, maximum air flow ventilation is provided between each P.C. board whereby electronic overheating is prevented while, at the same time, employing one-piece shelf members for maximum rigidity.

In summary, it is important to note that the complete rack comprises only four members, each of which can be fabricated very easily, such by a single stamping press operation. That is, ends 12, 14 can be stamped to form their precise outline and the flanges and tabs can be precisely bent to provide critical precision spacing of the shelf members in both the vertical and front-to-back measurements. Similarly, shelf members 16, 18 can be punched-out in a single operation with each hole 38, slot 40 and connector hole 30 precisely aligned so that each P.C. board is accurately aligned with its corresponding connector 31 and can be easily plugged therein without any misalignment problems. Lastly, the four precision parts can be rapidly assembled as by spot welding, bolting or riveting without any jigs or fixtures.

We claim:

1. A printed circuit card rack and guide assembly comprising,
   a. a pair of horizontally spaced end plates,
   b. a pair of vertically spaced shelf means connected to said end plates,
   c. a plurality of pairs of apertures in said shelf means, at least one aperture of each pair being an elongated slot,
   d. a plurality of card guides, each of said card guides including snap-in projections snapped into one of said pairs of apertures, the size of said projections and said elongated slots being such as to slidably retain said projections in said slots,
   e. each of said card guides having a base and a pair of vertical sides forming a U-shaped cross-section,
   f. at least a portion of said base having a curved, pre-bowed shape, and
   g. each of said card guides being composed of material which is sufficiently resilient such that, upon insertion of a printed circuit card, said curved, pre-bowed base is at least partially flattened and said projection slides in said slot to accommodate elongation of said guide.

2. The printed circuit card rack and guide assembly as claimed in claim 1 wherein each of said guides comprise curved, pre-bowed mid-portions spaced from said shelf means, and flat surfaces adjacent said projections in engagement with said shelf means.

3. The printed circuit card rack and guide assembly as claimed in claim 1 wherein said shelf means comprise one-piece shelf members, said shelf members being bent at a plurality of right angles to form front and rear channel-shaped portions, and elongated vent slots in said shelf members extending substantially the full width between said card guides and substantially the full distance between said front and rear channel-shaped portions.

4. The printed circuit card rack as claimed in claim 3 wherein said front channel shaped portions include a flat, vertical front edge, and indicia means imprinted on said edge in vertical alignment with each card guide for indicating the index position of each printed circuit card.

5. A printed circuit card rack comprising:
   a. a pair of horizontally spaced end plates,
   b. a pair of upper and lower horizontal members connected to said end plates,
   c. a plurality of slightly elongated slots in said horizontal members,
   d. a plurality of prebowed card guides,
   e. means securing said prebowed card guides to said horizontal members,
   f. said securing means including projection means extending through and slidable in said slightly elongated slots for accommodating variations in the length of said prebowed card guides.

6. The printed circuit card rack as claimed in claim 5 wherein said prebowed card guides include integral snap-in projections forming said projection means, said snap-in projections including reduced diameter portions having diameters slightly less than the width of said slots, and enlarged diameter portions having diameters slightly greater than the width of said slots.

7. The printed circuit card rack as claimed in claim 5 wherein said horizontal members include vertical flanges, each of said end plates including integral tabs engaging and secured to said vertical flanges, each of said end plates further including horizontal flanges rigidly connected to said horizontal members.

8. The printed circuit card rack as claimed in claim 7 wherein said vertical flanges of said horizontal members are spot welded to said tabs, and said horizontal members are spot welded to said flanges on said end plates.

* * * * *